US006765263B2

United States Patent
Park

(10) Patent No.: US 6,765,263 B2
(45) Date of Patent: Jul. 20, 2004

(54) SEMICONDUCTOR DEVICE AND METHOD FOR FABRICATING THE SAME

(75) Inventor: Cheol Soo Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/325,392

(22) Filed: Dec. 19, 2002

(65) Prior Publication Data

US 2003/0116800 A1 Jun. 26, 2003

(30) Foreign Application Priority Data

Dec. 24, 2001 (KR) .............................. 10-2001-0084007

(51) Int. Cl.[7] .............................................. H01L 29/72
(52) U.S. Cl. ...................... 257/329; 257/333; 257/347
(58) Field of Search ............................... 257/329, 333, 257/347

(56) References Cited

U.S. PATENT DOCUMENTS 6,232,196 B1  5/2001  Raaijmakers et al.
6,255,182 B1  7/2001  Wieczorek et al.
2002/0140032 A1 * 10/2002  Cho et al. ................. 257/347

* cited by examiner

Primary Examiner—Edward Wojciechowicz
(74) Attorney, Agent, or Firm—Timothy J. Keefer; Seyfarth Shaw LLP

(57) ABSTRACT

The present invention relates to a semiconductor device and a fabricating method thereof. The fabricating method comprises: forming an insulating film on a silicon substrate; forming a first conductive well of a first conductive type in the silicon substrate; first and second conductive layers of a second conductive type at a portion below the surface of the first conductive well and in the inner region of the first conductive well, respectively; patterning the insulating film and the first conductive layer of the second conductive type, so that contact holes are formed in such a manner that the second conductive layer formed in the inner region of the first conductive well is exposed through the contact holes; forming a gate insulating film on the sidewall of the first conductive well in the contact holes; and forming a gate electrode on the surface of the gate insulating film in the contact holes.

3 Claims, 3 Drawing Sheets

US 6,765,263 B2

SEMICONDUCTOR DEVICE AND METHOD FOR FABRICATING THE SAME

BACKGROUND OF THE INVENTION

1. Field of the Invention

The present invention relates in general to a semiconductor device and a fabricating method thereof, and more particularly to a semiconductor device and a method for fabricating the same, which has a transistor of a vertical structure.

2. Description of the Prior Art

Generally, a transistor has a horizontal structure, in which a gate electrode or a source/drain region has a horizontal structure, thereby occupying large areas. Furthermore, in this transistor, a minimum design rule is severely restricted, a fabricating process is complex, and device characteristics are not much improved.

In order to improve these problems including the severe restriction on minimum design rule, the complex fabrication process and the unimproved device characteristics, transistors having a vertical structure other than the horizontal structure were recently proposed. However, such transistors having the vertical structure have a problem in that a fabricating process is also complex.

SUMMARY OF THE INVENTION

Accordingly, the present invention has been made to solve the above-mentioned problems occurring in the prior art, and an object of the present invention is to provide a semiconductor having a vertical transistor structure, and a method for fabricating the same, which allows a fabrication process to be simple.

To achieve the above object, in one aspect, the present invention provides a semiconductor device, which comprises: an insulating film formed on a silicon substrate; a first conductive well of a first conductive type formed in the inner region of the silicon substrate; a first conductive layer of a second conductive type formed on the first conductive type well; a second well of the first conductive type formed on the second conductive layer; a second conductive layer of the second conductive type formed on the second well of the second conductive type; a gate oxide film on the side of the second well of the first conductive type; and a gate electrode formed on the surface of the gate oxide film.

In another aspect, the present invention provides a method for fabricating a semiconductor device, which comprises the steps of: forming an insulating film on a silicon substrate; forming a first conductive well of a first conductive type on the insulating film; forming first and second conductive layers of a second conductive type at a portion below the surface of the first conductive well and in the inner region of the first conductive well, respectively; patterning the insulating film and the first conductive layer of the second conductive type, so that contact holes are formed in such a manner that the second conductive layer formed in the inner region of the first conductive well is exposed through the contact holes; forming a gate insulating film on the sidewall of the first conductive well in the contact holes; and forming a gate electrode on the surface of the gate insulating film in the contact holes.

Preferably, the method of fabricating the semiconductor device according to the present invention further comprises the steps of forming an insulating film for planarization on the entire structure, after forming the gate electrode; forming contact holes in the insulating film for planarization in such a manner that the first conductive layer of the second conductive type and the gate electrode are exposed through the contact holes; and forming conductive plugs in the contact holes in such a manner that the conductive plugs are connected to the first conductive layer of the second conductive type and the gate electrode, respectively.

In the method of the present invention, the step of forming the gate insulating film on the side of the first conductive well is preferably achieved by carrying out an oxidation process.

Additionally, in the semiconductor device and the fabricating method thereof according to the present invention, the thickness of the portion of the gate insulating film, which is grown on the sidewall of the first conductive well is preferably thinner than the thickness of the portion of the gate insulating film, which is grown on the first and second conductive layers of the second conductive-type.

Furthermore, in the present invention, the insulating film for planarization is preferably planarized by CMP treatment.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of a semiconductor device and a fabricating method thereof according to the present invention will be described in detail with reference to the accompanying drawings.

FIGS. 1 to 5 are cross-sectional views illustrating a semiconductor device and a fabricating method thereof according to the present invention.

Figure 1:
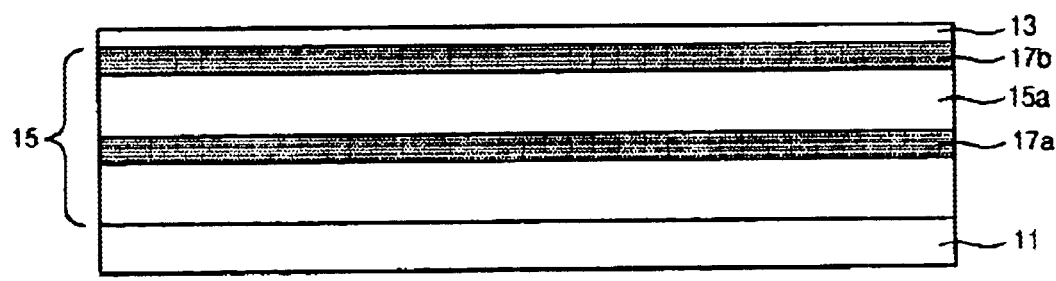
FIGS. 1 to 5 are cross-sectional views illustrating a semiconductor device and a fabricating method thereof according to the present invention.

As shown in FIG. 1, a first insulating film 13 is first thermally grown on a silicon substrate 11 to a fixed thickness, after which a first P-type well 15 is formed in the inner region of the silicon substrate 11.

Then, phosphorus or arsenic ions, as N-type impurities, are implanted into the first P-type well 15, so that a source region 17a, a second P-type well 15a and a drain region 17b are formed in the inner region of the first p-type well 15 and at a portion below the upper surface of the first p-type well 15, respectively. At this time, the channel length is controlled by the amount of energy used in the ion implantation process for forming the source/drain region. Although not shown in the drawings, in order to remove threshold voltage (Vt), a channel doping process may be carried out according to temperature or annealing time using a PSG or BSG film deposited on the entire structure, or a doping process may be conducted according to implant tilt.

Figure 2:
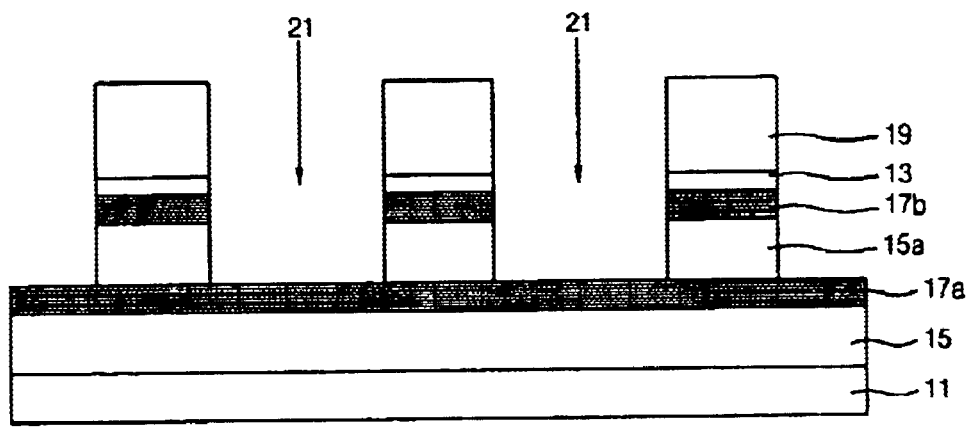

Referring to FIG. 2, thereafter, a photoresist film (not shown) is applied on the first insulating film 13, and exposed to light and developed according to a photolithographic process. The developed photoresist film is selectively patterned so as to form a photoresist pattern 19 service as a mask for device isolation.

Next, using the photoresist pattern 19 as a mask, the first insulating film 13, the $N^+$ drain region 17b and the second P-type well 15a are successively anisotropically etched so as to form contact holes 21 through which the N⁺ source region is exposed. Then, the photoresist pattern 19 is removed.

Figure 3:
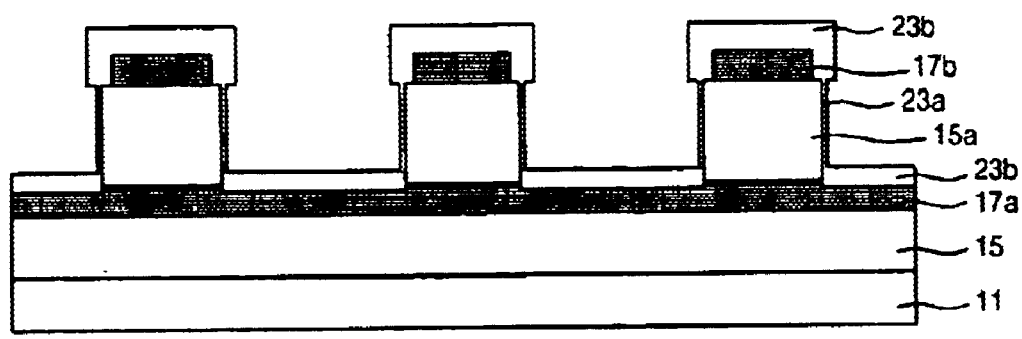

As shown in FIG. 3, the resulting structure is subjected to an oxidation process, so that a second insulating film 23a and 23b are formed on the N⁺ drain region 17b, on the side of the second P-type well 15a and on the surface of the N⁺ source region 17a. At this time, if the portion of the second insulating film, which is formed on the side of the second P-type well 15a, has several tens of Angstroms (Å), the portion of the second insulating film, which is formed on the N⁺ source region 17a and the n⁺ drain region 17b, will be grown to a thickness of several hundred of Angstroms (Å). Moreover, the portion of the second insulating film 23a and 23b, which is formed on the side of the second P-type well 15a, serves as a gate insulating film 23a.

Meanwhile, by virtue of the thickness difference between the oxide films, which are grown during an oxidation process on the channel region and the highly doped source/drain region, respectively, the short circuits between a source/drain region and a conductive layer for forming a gate electrode can be prevented, and junction capacitance can be minimized.

Figure 4:
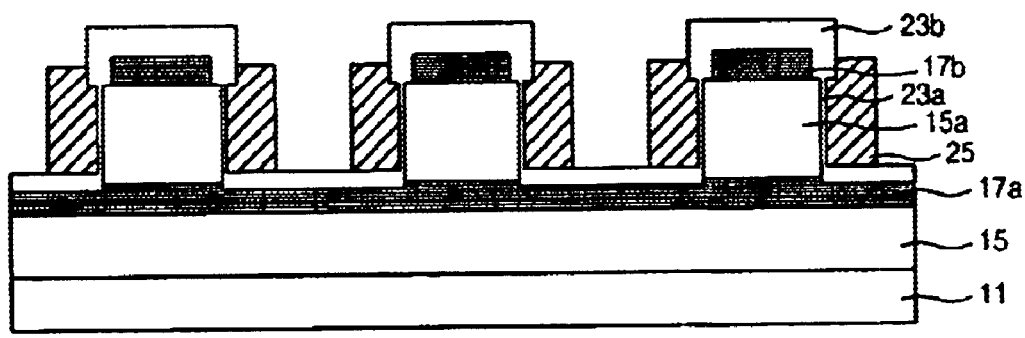

As shown in FIG. 4, a conductive layer (not shown) for forming a gate electrode is then deposited in a thick layer on the upper surface of the entire structure. Next, the deposited conductive layer (not shown) is blanket etched by a dry etching process so as to form a gate electrode 25 on the surface of the gate insulating film 23b.

Figure 5:
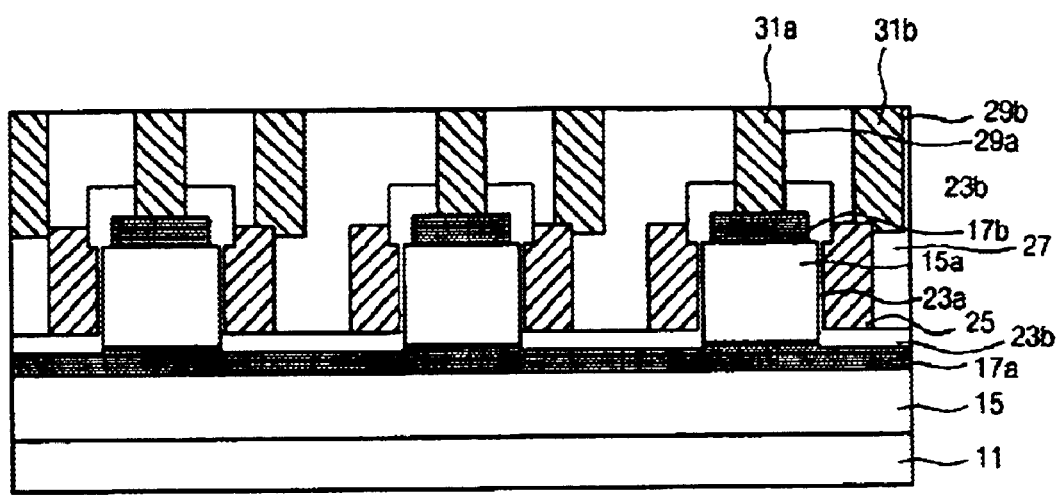

As shown in FIG. 5, a thick insulating film 27 for planarization is applied on the entire structure including the gate electrode 25, and treated by a CMP process so as to be planarized.

Although not shown in the drawings, a photoresist film (not shown) is then applied on the planarized insulating film 27, and exposed to light and developed according to a photolithographic process. Then, the developed photoresist pattern is selectively patterned so as to form a photoresist pattern (not shown) At this time, the photoresist pattern is formed in such a manner that it remains only on portions excepting the portions corresponding to the N⁺ drain region 17b and the gate electrode 25.

Then, using the photoresist pattern (not shown) as a mask, the planarized insulating film 27 is selectively removed so as to form contact holes 29a and 29b through which the upper surface of the N⁺ drain region 17b and the upper surface of the gate electrode 25 are exposed.

Thereafter, a conductive layer (not shown) is deposited on the planarized insulating film 27 including the contact holes 29a and 29b. Then, the deposited conductive layer (not shown) is blanket etched or treated by a CMP process, so that conductive plugs 31a and 31b, which are connected to the n⁺ drain region 17b and the gate electrode 25, respectively, are formed in the contact holes 29a and 29b. As a result, a transistor having a cylindrical structure is fabricated.

As described above, the semiconductor device and the fabricating method thereof have the following effects.

In the method of fabricating the semiconductor device according to the present invention, by virtue of the thickness difference between the oxide films, which are grown on the channel region and the highly doped source/drain region during the oxidation process, respectively, the short circuits between the source/drain region and the conductive layer for forming the gate electrode can be prevented, and junction capacitance can be minimized.

In addition, even when the present invention is applied to fabricate the transistor having the vertical structure, it allows the fabricating process to be simple.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, which comprises the steps of:

forming an insulating film on a silicon substrate;

forming a first conductive well in the silicon substrate;

forming a source and drain region in the first conductive well by performing a ion implantation, wherein the source region is formed in the inner region of the first conductive well and the drain region is formed at a portion below the surface of the first conductive well;

etching the first insulating film, the drain region, and the portion of the first conductive well interposed between the source region and the drain region to expose the source region;

growing a second insulating film on each portion of the surface of the exposed source region, a side of the etched drain region and a side of the etched first conductive well by carrying out an oxidation process, wherein the second insulating film is grown so that a thickness grown on the side of the first conductive well is thinner than that crown on a surface of the source and drain regions, and the second insulating layer is used as a gate insulating film, wherein the second insulating film on the surface of the drain region includes the first insulating film;

depositing a conductive layer on the entire structure; and forming a gate electrode on the second insulating film on the side of the first conductive well by blanket etching the conductive layer.

2. The method of claim 1, further comprising the steps of:

forming a third insulating film on the gate electrode;

forming contact holes in the third insulating film in such a manner that the drain region and the gate electrode are exposed through the contact holes; and forming conductive plugs in the contact holes, respectively.

3. The method of claim 1, further comprising the steps of: performing a channel doping by depositing a PSG or BPSG film on the entire structure and then annealing or by performing a tilt implantation in order to control threshold voltage (Vt), after forming the source and drain regions.

* * * * *